United States Patent
Nakamura

(10) Patent No.: US 6,486,073 B1
(45) Date of Patent: Nov. 26, 2002

(54) METHOD FOR STRIPPING A PHOTO RESIST ON AN ALUMINUM ALLOY

(75) Inventor: Moritaka Nakamura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/639,113

(22) Filed: Aug. 16, 2000

Related U.S. Application Data

(62) Division of application No. 08/839,371, filed on Apr. 18, 1997, now Pat. No. 6,184,148, which is a continuation of application No. 08/625,046, filed on Mar. 29, 1996, now abandoned, which is a continuation of application No. 07/711,382, filed on Jun. 6, 1991, now abandoned, which is a continuation of application No. 07/525,228, filed on May 18, 1990, now abandoned, which is a continuation of application No. 07/055,554, filed on May 29, 1987, now abandoned.

(30) Foreign Application Priority Data

May 29, 1986 (JP) ............................................. 61-124123

(51) Int. Cl.$^7$ ............................................. H01L 21/302
(52) U.S. Cl. ........................ 438/715; 438/720; 438/725; 438/742
(58) Field of Search ................................ 438/715, 720, 438/725, 742

(56) References Cited

U.S. PATENT DOCUMENTS

| | | | |
|---|---|---|---|
| 4,370,195 A | | 1/1983 | Halon et al. |
| 4,511,429 A | | 4/1985 | Mizutani et al. |
| 4,512,868 A | * | 4/1985 | Fujimura et al. |
| 4,592,800 A | | 6/1986 | Landau et al. |
| 4,609,428 A | | 9/1986 | Fujimura |
| 4,631,105 A | | 12/1986 | Carroll et al. |
| 4,632,719 A | | 12/1986 | Chow et al. |
| 4,662,977 A | | 5/1987 | Motley et al. |
| 4,699,689 A | | 10/1987 | Bersin |
| 4,718,976 A | | 1/1988 | Fujimura |

FOREIGN PATENT DOCUMENTS

| | | | |
|---|---|---|---|
| EP | 00-10138 | | 4/1980 |
| JP | 56-55050 | * | 5/1981 |
| JP | 59-3927 | * | 1/1984 |
| JP | 59-3927 | | 4/1984 |
| JP | 59-186326 | * | 10/1984 |
| JP | 59-186326 | | 2/1985 |

OTHER PUBLICATIONS

G.T. Chiu et al., "Plasma Removal of Residue Following Reactive Ion Etching of Aluminum and Aluminum Alloys", IBM Techincal Disclosure Bulletin, vol. 21, No. 6, Nov. 1970.

Flamm et al., "Plasma Etching an Introduction", 1988 Title page, Contents page, pp. 64–73, 166–171, 346–347, 380–385.

* cited by examiner

*Primary Examiner*—Thi Dang
(74) *Attorney, Agent, or Firm*—Staas & Halsey LLP

(57) ABSTRACT

An interconnection pattern made of an aluminum alloy, such as Al—Cu, on a semiconductor IC, is dry etched in an etching gas containing a chlorine component. A photo resist stripping process is carried out at a location down stream of the etching process using a conventional stripping gas, such as $CF_4+O_2$, at room temperature. Before the resist-stripped substrate is exposed to open air, the substrate is heated in a vacuum to a temperature above 100° C., to remove residual chlorine components.

36 Claims, 2 Drawing Sheets

METHOD FOR STRIPPING A PHOTO RESIST ON AN ALUMINUM ALLOY

This application is a divisional application of U.S. Ser. No. 08/839,371, filed Apr. 18, 1997, now U.S. Pat. No. 6,184,148 which was a continuation of U.S. Ser. No. 08/625,046, filed Mar. 29, 1996, now abandoned which was a continuation of U.S. Ser. No. 07/711,382, filed Jun. 6, 1991, now abandoned which was a continuation of U.S. Ser. No. 07/525,228, filed May 18, 1990, now abandoned which was a continuation of U.S. Ser. No. 07/055,554, filed May 29, 1987 now abandoned.

BACKGROUND OF THE INVENTION

1. Field of the Invention

This invention relates to a method for stripping a photo resist from a layer made of an aluminum alloy, such as aluminum-copper, formed on a semiconductor substrate.

2. Description of the Related Art

Aluminum or aluminum-silicon alloys containing several percent of silicon have been generally used as interconnection layers on semiconductor devices. However, it is also well known that such interconnection layers may be broken down by electro migration, particularly in semiconductor devices where a very fine interconnection is required, such as 4 μm for a high speed ECL (Emitter Coupled Logic) or 1 μm for MOS (Metal Oxide Semiconductor), to achieve a greater density of integration and accordingly higher density flow of current therethrough. In order to prevent such electro migration of interconnection layers, aluminum-copper alloys containing 2 to 4% copper have come to be used, particularly where high current-density is involved, such as in bipolar devices or high-speed logic circuits. However, aluminum-copper alloys present the problem of the presence therein of residual chlorine components.

When an aluminum or aluminum alloy layer is plasma dry-etched using chlorinated gases, such as gaseous mixtures containing chlorine (referred to hereinafter as $Cl_2$), silicon tetrachloride (referred to hereinafter as $SiCl_4$), or boron tri-chloride ($BCl_3$), the mechanism of the undesirable reaction resulting from residual chlorine is as follows.

$$Al + Cl^* \rightarrow AlCl_3\uparrow, Al_2Cl_6\uparrow$$

where C* denotes a chlorine radical produced in the plasma, and ↑ denotes sublimnation. Aluminum (Al) reacts with Cl* to produce $AlCl_3$ or $Al_2Cl_6$, which then sublimes, and the aluminum continues to be etched in this manner as long as residual chlorine is present. When the etch-processed substrate is brought out into open air, the $AlCl_3$, etc., which has sublimed and then has again deposited on a surface of the side wall of the aluminum layer or on the photo resist reacts with the water content in the open air, because the $AlCl_3$ is deliquescent. So, hydrochloric acid (HCl) is produced from the $AlCl_3$, etc., according to the following formula:

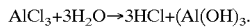
$$AlCl_3 + 3H_2O \rightarrow 3HCl + (Al(OH)_3).$$

Then, the HCl reacts with the Al to produce $AlCl_3$ again, as follows.

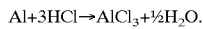
$$Al + 3HCl \rightarrow AlCl_3 + \tfrac{3}{2}H_2O.$$

Thus, the reactions are continued repeatedly. In other words, the corrosion of the aluminum layer continues indefinitely. In order to prevent this corrosion, one or a combination of the below-described procedures are carried out for aluminum, aluminum-titanium (Al—Ti) alloys or aluminum-silicon (Al—Si) alloys, after the dry etching process.

(1) Stripping the photo resist without exposing the substrate to open air so as to prevent the chlorine deposition on the substrate from reacting with the water content of the open air.

(2) Drying the substrate with a hot nitrogen gas flow at a temperature as high as 100 to 200° C., and then washing the substrate with water so as to remove the residual chlorine.

(3) Washing the substrate with water, and then baking the substrate in an oxygen atmosphere at a temperature of approximately 350° C. so as to remove the residual chlorine.

(4) Plasma-processing the substrate in a fluorinated gas, such as $CF_4$, $SF_6$ or $CHF_3$, so as to replace the residual chlorine atoms with fluorine atoms produced in the plasma. Thus, a firm aluminum fluoride (AlF or $AlF_3$) layer is formed over the aluminum surface to prevent the chlorine component from reacting with water content in the air.

(5) Plasma-processing the substrate in hydrogen gas, which reacts with the residual chlorine component to produce hydrogen chloride.

By the application of the above-mentioned procedures, residual chlorine component on substrates made of aluminum or aluminum alloys can be removed and, accordingly, corrosion can be prevented. However, when etching aluminum alloys, such as aluminum-copper (Al—Cu) or aluminum-copper-silicon (Al—Cu—Si), the residual chlorine component is in the form of $Cu_xCl_y$ or a mixture of Cu, Cl, Al and carbon from the photo resist, and such materials, having much higher sublimation temperatures than aluminum chloride, are difficult to remove. Therefore, such residual chlorine containing components may cause corrosion even when the above-described chlorine-removal procedures are employed.

Therefore, procedures for more effectively removing chlorine residuals have been sought to overcome the above-mentioned problems.

SUMMARY OF THE INVENTION

It is an object of the invention to provide a method for forming a pattern of an aluminum-copper alloy on a semiconductor substrate without encountering the corrosion problem caused by chlorine residual on the substrate.

The method according to the invention includes the steps of: forming a layer made of aluminum-copper alloy on a semiconductor substrate; forming a resist pattern on said alloy layer; etching said alloy layer by the use of said resist pattern in a chlorinated gas plasma so as to form an alloy pattern; downstream stripping said resist pattern in an atmosphere containing a reactive species; and heating the thus produced substrate in a vacuum at a temperature higher than 100° C., whereby the residual chlorine component is removed. The stripping process and the heating process may be combined; that is to say, they may be carried out concurrently.

The above-mentioned features and advantages of the present invention, together with other objects and advantages, which will become apparent, will be more fully described hereinafter, with reference being made to the accompanying drawings which form a part hereof, wherein like numerals refer to like parts throughout.

DESCRIPTION OF THE PREFERRED EMBODIMENTS

Figure 1A:
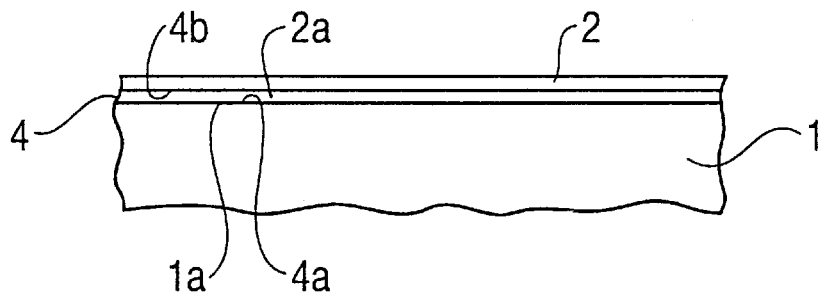
FIGS. 1(a) through 1(d) schematically illustrate the main part of a semiconductor device at respective steps of the fabrication process according to the method of the present invention.
Figure 1B:
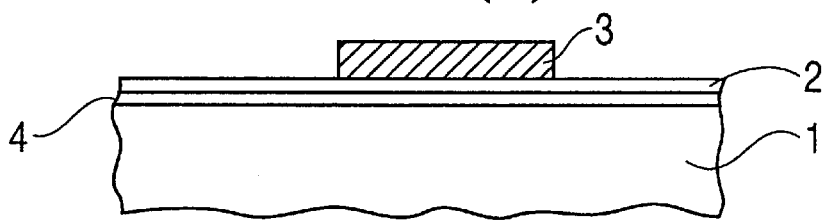
Figure 1C:
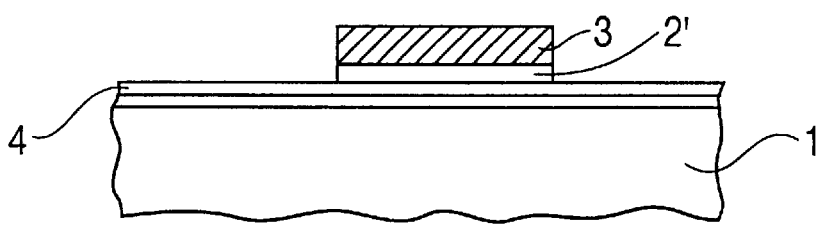
Figure 1D:
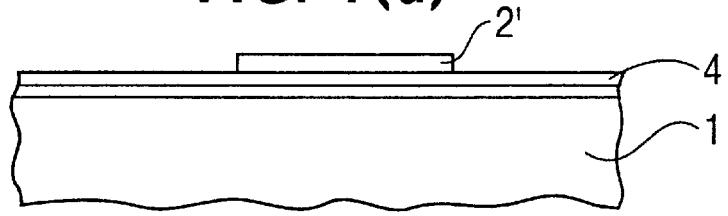

Referring now to FIGS. 1(a)–1(d), the fabrication steps of the method of the present invention are shown. By general fabrication processing not shown in the figures, the semiconductor substrate 1 has already been fabricated with IC devices therein and a surface 1a of the substrate 1 has then been coated with an insulation film 4 having a first surface 4a formed on the substrate surface 1a, and a second, opposite surface 4b made of PSG (phosphor silicate glass), for example. As shown in FIG. 1(a), a layer 2 made of an aluminum-copper alloy, Al—Cu (4%) for example, is formed to have a thickness of as much as approximately 8000 Å over the entire insulated film surface 4b of the semiconductor substrate 1 using a known general method, such as sputtering. In this regard, a lower surface 2a of the layer 2 is formed on the second surface 4b of the insulation film 4. A patterned photo resist film 3 is formed on alloy layer 2 as shown in FIG. 1(b) using known general lithography techniques. The exposed portion of layer 2, namely the portion which is not masked by the photo resist pattern 3, is removed using known general dry etching methods. The dry etching may be accomplished by a reactive ion etching method using an etching gas, such as a gaseous mixture of chlorine ($Cl_2$)(24 sccm (standard cubic centimeter per minutes)) and silicon tetrachloride ($SiCl_4$)(40 sccm), as an etching agent. The gas pressure is reduced to approximately 0.02 Torr, and a radio frequency power of 13.56 MHz, for example, and 250 W, for example, is applied thereto for 5 minutes, for example, using well known methods. The etching gas is dissociated in a glow discharge driven by the applied radio frequency power and the thus produced chlorine atoms are active for reaction with the aluminum as well as the copper of the alloy. The aluminum chloride thus produced sublimes in the manner explained above, in the description of the prior art, copper chloride is sputtered by the energetic ion bombardment, and the exposed portion of the alloy is thus etched and removed, leaving the patterned layer 2', with the resist layer 3 thereon, as shown in FIG. 1(c). Next, the substrate 1 is transferred to a dry processing apparatus for stripping the patterned photo resist. During such transfer, the substrate 1 is passed through a vacuum system or a system purged with an inert gas, in order to avoid exposure to open air. If the substrate is exposed to the open air, the residual chlorine component on the substrate will react with water contained in the air and the alloy will be corroded as explained above.

Then, the patterned photo resist 3 on the patterned alloy layer 2' is stripped using known downstream etching methods. A stripping apparatus using microwave power is preferably employed for such stripping step, and the procedure is referred to as downstream ashing or after-glow ashing. Such methodology will be described hereinafter. A gaseous mixture of $CF_4$ (100 sccm) and oxygen ($O_2$)(1500 sccm), for example, is used as the dry etching stripping gas at a pressure of approximately 1 Torr, and microwave power at 2.45 GHz and 1 KW is applied thereto for 2 minutes, for example, while the temperature of the substrate is kept at room temperature, for example, about 30° C.

Figure 2:
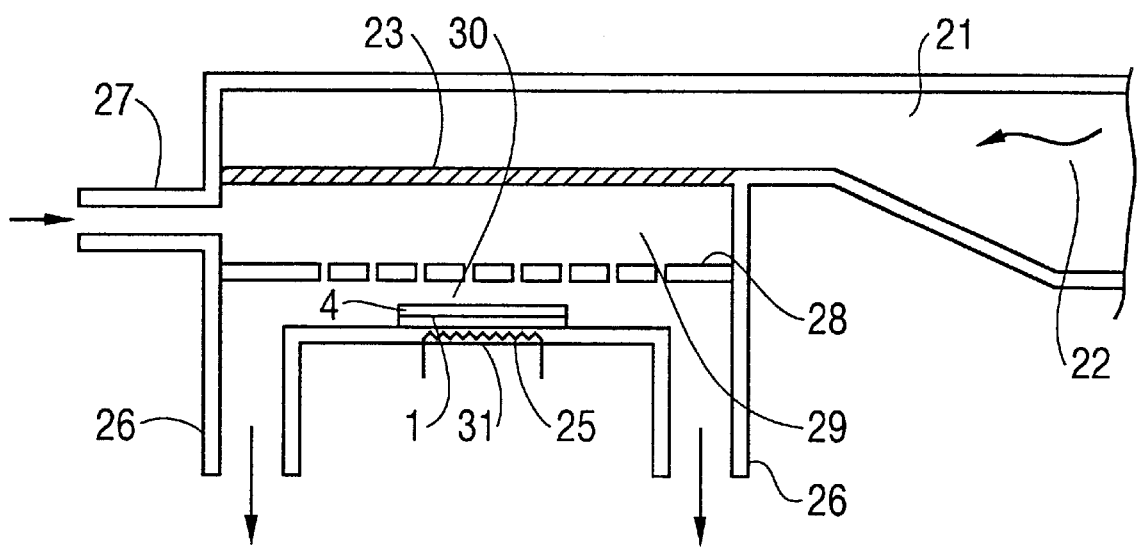
FIG. 2 schematically illustrates a dry processing apparatus using microwave power for the stripping step of the present invention.

After finishing this stripping process, and with reference to FIG. 2, the substrate is heated by an electric heater 31 in stage 25 to approximately 300° C., and such temperature is maintained for 2 minutes, for example, while the apparatus is evacuated to 0.2–0.3 Torr, so that the residual chlorine component is baked out. After the substrate is sufficiently cooled, the substrate is removed from the apparatus, and the processes of the invention are completed. The method just described shall be referred to as method I. It is also possible to heat the substrate at a heating stage that is separate from the stripping stage 25 in the vacuum chamber in order to avoid the cycle time necessary for heating/cooling the massive stripping stage apparatus.

The baking process of method I may be combined with the stripping process. In other words, these two processes may be carried out concurrently. In such case, the stripping process is carried out while the substrate 1 is being heated from 200 to 300° C. by the electric heater 31 mounted in stage 25. Such alternative method shall be referred to as method II.

When the stripping and baking processes are combined as in method II, the stripping gas may be a gaseous mixture of nitrogen ($N_2$)(100 sccm) and oxygen ($O_2$)(1500 sccm) at approximately 1 Torr, and the substrate may be heated to 200 top 300° C. This method shall be referred to as method III.

In these methods just described, the combination of the heating and the downstream stripping steps is essential, because with heating alone, the residual chlorine components cannot be removed at temperatures under 400° C. Moreover, conventional plasma stripping causes a particle problem due to $Al_2O_3$ formation.

In order to confirm the effect of the above-described methods of the present invention, the processed substrate is exposed to open air for 2 days. The alloy pattern is then optically observed to check for the existence of corrosion. Moreover, residual chlorine atoms are measured by fluorescent X-ray spectroscopy. The results are as follows. In the table, line (a) shows the temperature of the substrate during the heating step, line (b) shows the results of the check for existence of corrosion by optical observation using a microscope of magnification 1000, and line (c) shows the amount of residual chlorine atoms determined by spectroscopy, in units of cps ("count per second"), where 10-cps corresponds to $1.64 \times 10^4$ atoms per $cm^2$.

| METHOD | I | II | II | II | II | II | III |
|---|---|---|---|---|---|---|---|
| (a) | 300 | 30 | 70 | 110 | 150 | 200 | 300° C. |
| (b) | no | yes | yes | no | no | no | no |
| (c) | 8.1 | 141.1 | 122.2 | 21.4 | 11.6 | 9.5 | 8.3 cps |

As seen in the table, when the substrate is heated to temperatures higher than 100° C., the residual chlorine is evidently reduced and no corrosion is observed. The amount of the residual chlorine is reduced as the heating temperature is increased, however, on the other hand, when the temperature exceeds 300° C., the aluminum is affected, for example hillocks are formed on the surface of the aluminum. Therefore, the temperature must be lower than 400° C., and preferably should be between 250 and 300° C.

Details of an example of the dry etching apparatus for stripping the photo resist are hereinafter described, referring to FIG. 2. The apparatus employs microwave power for producing reactive species of stripping agents. The chlorine etched substrate 1 with pattern thereon is loaded on the stage 25 in a reaction chamber 30. In the stage 25, an electric heater 31 and a thermometer (not shown in the figure) are mounted to heat the substrate when required. The chamber 30 is evacuated through gas outlets 26 by conventional evacuation equipment, which is not shown in the figure. Into the chamber 30, an etching or stripping gas is introduced through the gas inlet 27. By balancing gas evacuation and gas introduction, the gas pressure internally of the chamber 30 is controlled to obtain the required gas pressure. A microwave-passing window 23 made of an insulating material, such as quartz or alumina, is installed to extend perpendicularly of the electric field in waveguide 21 and in sealing relationship to chamber 30 to maintain the vacuum in the latter. A metal shield plate 28 having many small holes therein shields reaction chamber 30 from the microwaves, thus a plasma generation room 29 is formed between the microwave-passing window 23 and the shield plate 28. Microwave 22 power is fed through the waveguide 21 and through the microwave-passing window 23 and into the plasma generation room 29. In the plasma generation room 29, the etching gas is made into a plasma by excitation by the microwave power. Reactive species, such as oxygen atoms produced in the plasma, exit from room 29 through the holes of the shield plate 28 and flow directly on to substrate 1, i.e., efficiently, because the shield plate 28 is located close to the substrate 1. The reactive species are very reactive with regard to the photo resist on the substrate, but do not harm the substrate by ionic bombardment, such as occurs during plasma etching, because the species passing through the holes of the shield plate 28 are not ionic and no ionic gasses are involved. Therefore, this type of apparatus is advantageously employed for stripping the photo resist.

Although aluminum-copper alloy is referred to in the above-described embodiment as the material to be processed, the present invention is also effective for other alloys such as AlCuSi and AlSiTiCu.

Although a mixture of $Cl_2$ and $SiCl_4$ is referred to as the etching gas for etching the alloy in the above-described embodiments, other chlorine gases, such as $BCl_3$, $CCl_4$ and $CHCl_3$, can be also used, as is well known.

Although a radio frequency of 13.56 MHz is employed in the above-described embodiment for etching the alloy, other radio frequencies such as a radio frequency of 400 HKz can also be used, as is well known.

Although a mixture of $CF_4$, $N_2$ and $O_2$ is referred to as the etching gas for stripping the photo resist in the above-described embodiments, other fluorinated gases, such as $CHF_3$, $C_2F_6$, $SF_6$, $NF_3$ or $CBrF_3$, can also be used singly or as mixtures in place of $CF_4$. Also, other nitrogen-containing gases, such as $N_2O$ or $NO_2$, can be used in place of $N_2$, again is well known.

Although a microwave frequency of 2.45 GHz has been explained in the above-described embodiment for stripping the photo resist, other radiation frequencies, such as, for example, a radio frequency of 13.56 MHz, might also be used, as is well known.

The many features and advantages of the invention are apparent from the detailed specification and thus, it is intended by the appended claims to cover all such features and advantages of the system which fall within the true spirit and scope of the invention. Further, since numerous modifications and changes may readily occur to those skilled in the art, it is not desired to limit the invention to the exact construction and operation shown and described, and accordingly, all suitable modifications and equivalents may be resorted to, falling within the scope of the invention.

What is claimed is:

1. A method for forming an aluminum-copper alloy wiring pattern on an insulation layer which is formed on a semiconductor substrate, an entire surface of which substrate is immune to damage from plasma due to the insulation layer, comprising the steps of:

forming, on the semiconductor substrate, over the insulation layer, a layer of aluminum alloy containing copper;

forming a resist pattern on said aluminum alloy layer to create a resist layer portion and an exposed layer portion;

etching the exposed layer portion using the resist pattern as a mask by using accelerated reactive ions in gas plasma containing at least chlorine ions to form a patterned layer, wherein a residual chlorine component is sputtered by ion bombardment on the resist pattern and on the insulation layer covering the semiconductor substrate;

subsequent to etching the exposed layer portion, downstream ashing the resist pattern isotropically by exposing the resist pattern to an atmosphere containing only non-ionic species, said atmosphere being created by generating gas plasma from reaction gas containing oxygen by applying electromagnetic power and directing non-ionic species in said gas plasma; and after the downstream ashing step, removing the residual chlorine component from the patterned layer and the insulation layer by heating the substrate with the patterned layer thereon in vacuum between 100° C. and 300° C. by a heated stage whereon the substrate is placed.

2. A method for forming an aluminum-copper alloy wiring pattern on an insulation layer which is formed on a semiconductor substrate, an entire surface of which substrate is immune to damage from plasma due to the insulation layer, comprising the steps of:

forming, on the semiconductor substrate, over the insulation layer, a layer of aluminum alloy containing copper;

forming a resist pattern on said aluminum alloy layer to create a resist layer portion and an exposed layer portion;

etching the exposed layer portion using the resist pattern as a mask by reactive ion etching using gas plasma containing chlorine ions in a first reaction chamber to form a patterned layer, wherein a residual chlorine component is sputtered by ion bombardment on the resist pattern and on the insulation layer covering the semiconductor substrate;

transferring the substrate to a second reaction chamber without exposing the substrate to an external atmosphere; and downstream ashing the resist pattern isotropically by exposing the resist pattern to an atmosphere containing only non-ionic species in the second reaction chamber, said atmosphere being created by generating gas plasma from reaction gas containing oxygen by applying electromagnetic power and directing non-ionic species in said gas plasma into the second reaction chamber;

wherein the substrate with the patterned layer thereon is maintained between 100° C. and 200° C., by a heated stage whereon the substrate is placed, during the downstream ashing step to remove the residual chlorine component from the patterned layer and the insulation layer.

3. A method for forming an aluminum-copper alloy wiring pattern on an insulation layer which is formed on a semiconductor substrate, an entire surface of which substrate is immune to damage from plasma due to the insulation layer, comprising the steps of:

forming, on the semiconductor substrate, over the insulation layer, a layer chosen to have a thickness of 1–4 µm from an aluminum alloy containing 2–4% copper;

forming a resist pattern on said aluminum alloy layer to create a resist layer portion and an exposed layer portion;

etching the exposed layer portion using the resist pattern as a mask by reactive etching using gas plasma containing chlorine ions to form a patterned layer, wherein a residual chlorine component is sputtered by ion bombardment on the resist pattern and on the insulation layer covering the semiconductor substrate, said residual chlorine component including at least one of cuprous chloride, cupric chloride and a mixture of Cu, Cl, Al and C;

downstream ashing the resist pattern isotropically by exposing the resist pattern to gas plasma containing only non-ionic species from reaction gas containing oxygen to which electromagnetic power has been applied, and from the ionic species of the gas plasma; and removing the residual chlorine component from the patterned layer and the insulation layer by heating the substrate with the patterned layer thereon in vacuum between 250° C. and 300° C. by a heated stage whereon the substrate is placed.

4. The method as recited in claim 3, wherein the heating and the ashing occur at the same time.

5. The method as recited in claim 3, wherein the heating occurs after the ashing.

6. The method as recited in claim 3, wherein the reaction gas comprises a fluorine containing compound and oxygen.

7. The method as recited in claim 3, wherein the non-ionic species is a reactive oxygen species produced by excitation of the reaction gas with microwave radiation at approximately 2.45 GHz.

8. The method as recited in claim 3, wherein the residual chlorine component on the patterned layer exists at less than 0.5 cps.

9. The method as recited in claim 1, wherein the semiconductor substrate to be treated has integrated circuit devices therein prior to formation of the insulation layer.

10. The method as recited in claim 9, wherein the insulation layer is made of phosphor-silicate-glass.

11. The method as recited in claim 1, wherein heating the substrate is carried out in a vacuum of pressure below approximately 0.3 Torr.

12. The method as recited in claim 1, wherein heating the substrate is carried out at a second separate heating stage different from a first stage used for removing the photoresist.

13. The method as recited in claim 12, wherein the first stage is maintained at approximately room temperature while the second stage is maintained below 300° C. for approximately 2 mins.

14. The method as recited in claim 2, wherein the semiconductor substrate to be treated has integrated circuit devices therein prior to formation of the insulation layer.

15. The method as recited in claim 3, wherein the semiconductor substrate to be treated has integrated circuit devices therein prior to formation of the insulation layer.

16. A method for forming a metal wiring pattern underlayered by an insulation layer disposed on a semiconductor substrate, comprising the steps of:

forming, on the semiconductor substrate having the insulation layer thereon, a metal layer containing copper;

forming a resist pattern on said metal layer to create a resist layer portion and an exposed layer portion;

etching the exposed layer portion using the resist pattern as a mask by using accelerating reactive ions in gas plasma containing at least chlorine ions to form a patterned layer, subsequent to etching the exposed layer pattern, downstream ashing the resist pattern isotropically by exposing the resist pattern to an atmosphere containing only non-ionic species, said atmosphere being created by generating gas plasma from reaction gas containing oxygen by applying electromagnetic power and directing only the non-ionic species to the substrate; and removing the residual chlorine component from the patterned layer and the insulation layer by heating the substrate with the patterned layer thereon, by a heated stage whereon the substrate is placed, such that the surface density of residual chlorine atoms falls below the order of two-digit figures in cps.

17. A method for forming a metal wiring pattern according to claim 16, wherein said metal layer is a layer of aluminum-copper alloy.

18. A method for forming a metal wiring pattern according to claim 16, wherein said step of removing is carried out in vacuum between 100° C. and 300° C.

19. A method for forming, in a single wafer reactor, an aluminum-copper alloy wiring pattern on an insulation layer which is formed on a semiconductor substrate, an entire surface of which substrate is immune to damage from plasma due to the insulation layer, comprising the steps of:

forming, on the semiconductor substrate, over the insulation layer, a layer of aluminum alloy containing copper;

forming a resist pattern on said aluminum alloy layer to create a resist layer portion and an exposed layer portion;

etching the exposed layer portion using the resist pattern as a mask by using accelerated reactive ions in gas plasma containing at least chlorine ions to form a patterned layer, wherein a residual chlorine component is sputtered by ion bombardment on the resist pattern and on the insulation layer covering the semiconductor substrate;

subsequent to etching the exposed layer portion, downstream ashing the resist pattern isotropically by exposing the resist pattern to an atmosphere containing only non-ionic species, said atmosphere being created by generating gas plasma from reaction gas containing oxygen by applying electromagnetic power and directing non-ionic species in said gas plasma; and after the downstream ashing step, removing the residual chlorine component from the patterned layer and the insulation layer by heating the substrate with the patterned layer thereon in vacuum between 100° C. and 300° C. by a heated stage whereon the substrate is placed.

20. A method for forming, in a single wafer reactor, an aluminum-copper alloy wiring pattern on an insulation layer which is formed on a semiconductor substrate, an entire surface of which substrate is immune to damage from plasma due to the insulation layer, comprising the steps of:

forming, on the semiconductor substrate, over the insulation layer, a layer of aluminum alloy containing copper;

forming a resist pattern on said aluminum alloy layer to create a resist layer portion and an exposed layer portion;

etching the exposed layer portion using the resist pattern as a mask by reactive ion etching using gas plasma containing chlorine ions in a first reaction chamber to form a patterned layer, wherein a residual chlorine component is sputtered by ion bombardment on the resist pattern and on the insulation layer covering the semiconductor substrate;

transferring the substrate to a second reaction chamber without exposing the substrate to an external atmosphere; and downstream ashing the resist pattern isotropically by exposing the resist pattern to an atmosphere containing only non-ionic species in the second reaction chamber, said atmosphere being created by generating gas plasma from reaction gas containing oxygen by applying electromagnetic power and directing non-ionic species in said gas plasma into the second reaction chamber;

wherein the substrate with the patterned layer thereon is maintained between 100° C. and 200° C., by a heated stage whereon the substrate is placed, during the downstream ashing step to remove the residual chlorine component from the patterned layer and the insulation layer.

21. A method for forming, in a single wafer reactor, an aluminum-copper alloy wiring pattern on an insulation layer which is formed on a semiconductor substrate, an entire surface of which substrate is immune to damage from plasma due to the insulation layer, comprising the steps of:

forming, on the semiconductor substrate, over the insulation layer, a layer chosen to have a thickness of 1–4 μm from an aluminum alloy containing 2–4% copper;

forming a resist pattern on said aluminum alloy layer to create a resist layer portion and an exposed layer portion;

etching the exposed layer portion using the resist pattern as a mask by reactive etching using gas plasma containing chlorine ions to form a patterned layer, wherein a residual chlorine component is sputtered by ion bombardment on the resist pattern and on the insulation layer covering the semiconductor substrate, said residual chlorine component including at least one of cuprous chloride, cupric chloride and a mixture of Cu, Cl, Al and C;

downstream ashing the resist pattern isotropically by exposing the resist pattern to gas plasma containing only non-ionic species from reaction gas containing oxygen to which electromagnetic power has been applied, and from the ionic species of the gas plasma; and removing the residual chlorine component from the patterned layer and the insulation layer by heating the substrate with the patterned layer thereon in vacuum between 250° C. and 300° C. by a heated stage whereon the substrate is placed.

22. The method as recited in claim 21, wherein the heating and the ashing occur at the same time.

23. The method as recited in claim 21, wherein the heating occurs after the ashing.

24. The method as recited in claim 21, wherein the reaction gas comprises a fluorine containing compound and oxygen.

25. The method as recited in claim 21, wherein the non-ionic species is a reactive oxygen species produced by excitation of the reaction gas with microwave radiation at approximately 2.45 GHz.

26. The method as recited in claim 21, wherein the residual chlorine component on the patterned layer exists at less than 0.5 cps.

27. The method as recited in claim 19, wherein the semiconductor substrate to be treated has integrated circuit devices therein prior to formation of the insulation layer.

28. The method as recited in claim 27, wherein the insulation layer is made of phosphor-silicate-glass.

29. The method as recited in claim 19, wherein heating the substrate is carried out in a vacuum of pressure below approximately 0.3 Torr.

30. The method as recited in claim 19, wherein heating the substrate is carried out at a second separate heating stage different from a first stage used for removing the photoresist.

31. The method as recited in claim 30, wherein the first stage is maintained at approximately room temperature while the second stage is maintained below 300° C. for approximately 2 mins.

32. The method as recited in claim 30, wherein the semiconductor substrate to be treated has integrated circuit devices therein prior to formation of the insulation layer.

33. The method as recited in claim 21, wherein the semiconductor substrate to be treated has integrated circuit devices therein prior to formation of the insulation layer.

34. A method for forming, in a single wafer reactor, a metal wiring pattern underlayered by an insulation layer disposed on a semiconductor substrate, comprising the steps of:

forming, on the semiconductor substrate having the insulation layer thereon, a metal layer containing copper;

forming a resist pattern on said metal layer to create a resist layer portion and an exposed layer portion;

etching the exposed layer portion using the resist pattern as a mask by using accelerating reactive ions in gas plasma containing at least chlorine ions to form a patterned layer, subsequent to etching the exposed layer pattern, downstream ashing the resist pattern isotropically by exposing the resist pattern to an atmosphere containing only non-ionic species, said atmosphere being created by generating gas plasma from reaction gas containing oxygen by applying electromagnetic power and directing only the non-ionic species to the substrate; and removing the residual chlorine component from the patterned layer and the insulation layer by heating the substrate with the patterned layer thereon, by a heated stage whereon the substrate is placed, such that the surface density of residual chlorine atoms falls below the order of two-digit figures in cps.

35. A method for forming a metal pattern according to claim 34, wherein said metal layer of aluminum-cooper alloy.

36. A method for forming a metal wiring pattern according to claim 34, wherein said step of removing is carried out between 100° C. and 300° C.

* * * * *